United States Patent
Kim et al.

(10) Patent No.: US 7,615,334 B2
(45) Date of Patent: Nov. 10, 2009

(54) INK COMPOSITION FOR ETCHING RESIST, METHOD OF FORMING ETCHING RESIST PATTERN USING THE SAME, AND METHOD OF FORMING MICROCHANNEL USING THE INK COMPOSITION

(75) Inventors: Joon Hyung Kim, Daejeon (KR); Hyunsik Kim, Daejeon (KR); Youngwoon Kwon, Daejeon (KR); Jung Hyun Seo, Daegu (KR)

(73) Assignee: LG Chem, Ltd., Seoul (KR)

( * ) Notice: Subject to any disclaimer, the term of this patent is extended or adjusted under 35 U.S.C. 154(b) by 310 days.

(21) Appl. No.: 11/227,089

(22) Filed: Sep. 16, 2005

(65) Prior Publication Data

US 2006/0060563 A1 Mar. 23, 2006

(30) Foreign Application Priority Data

Sep. 17, 2004 (KR) .................. 10-2004-0074556

(51) Int. Cl.
  *G03C 1/00* (2006.01)
  *G03F 7/00* (2006.01)
(52) U.S. Cl. ............... 430/283.1; 430/285.1; 430/287.1
(58) Field of Classification Search .................. None
  See application file for complete search history.

(56) References Cited

U.S. PATENT DOCUMENTS

| 4,564,580 A | 1/1986 | Ichimura et al. |
| 5,270,368 A | 12/1993 | Lent et al. |
| 5,422,222 A | 6/1995 | Akaki et al. |
| 5,741,621 A * | 4/1998 | Kempf et al. ............... 430/253 |
| 6,040,002 A * | 3/2000 | Noguchi et al. ............... 216/13 |
| 6,136,507 A * | 10/2000 | Morigaki .................. 430/283.1 |
| 6,150,430 A * | 11/2000 | Walters et al. ................ 522/79 |
| 2005/0014004 A1* | 1/2005 | King et al. .................... 428/413 |
| 2005/0170094 A1* | 8/2005 | Roth et al. ................... 427/256 |

FOREIGN PATENT DOCUMENTS

| CN | 1230568 | 10/1999 |
| JP | 56-66089 | 4/1981 |
| JP | 56-66089 | 6/1981 |
| JP | 62-181490 | 8/1987 |
| JP | 04-141662 | 5/1992 |
| JP | 08-211602 | 8/1996 |
| JP | 09-008436 | 1/1997 |
| JP | 11-172177 | 6/1999 |
| JP | 11-172179 | 6/1999 |
| JP | 11-181050 | 7/1999 |
| JP | 11-258797 | 9/1999 |
| JP | 11258797 | 9/1999 |
| JP | 2002-064262 | 2/2002 |
| JP | 2003-142801 | 5/2003 |
| WO | WO 01/11426 | 2/2001 |

* cited by examiner

*Primary Examiner*—Duy-Vu N Deo
(74) *Attorney, Agent, or Firm*—McKenna Long & Aldridge LLP

(57) ABSTRACT

Provided are an ink composition for an etching resist, a method of forming an etching resist pattern using the ink composition, and a method of forming a microchannel using the ink composition. The ink composition is suitable for forming a micro pattern due to its poor spreading on the substrate and is suitable for etching-resist for copper of a printed circuit board and deep etching a stainless steel substrate due to its excellent chemical properties that allow it to resist an etching solution.

7 Claims, 1 Drawing Sheet

(a)

(b)

(c)

(d)

INK COMPOSITION FOR ETCHING RESIST, METHOD OF FORMING ETCHING RESIST PATTERN USING THE SAME, AND METHOD OF FORMING MICROCHANNEL USING THE INK COMPOSITION

CROSS-REFERENCE TO RELATED PATENT APPLICATIONS

This application claims the benefit of Korean Patent Application No. 10-2004-0074556, filed on Sep. 17, 2004 in the Korean Intellectual Property Office, the disclosure of which is incorporated herein in its entirety by reference.

BACKGROUND OF THE INVENTION

1. Field of the Invention

The present invention relates to an ink composition for an etching resist, a method of forming an etching resist pattern using the same, and a method of forming a microchannel using the ink composition.

2. Description of the Related Art

An etching resist, which is an etching-resist thin film used to form a pattern by etching, is mainly used in manufacturing processes for semiconductor circuits and printed circuit boards. In such manufacturing processes, a photoresist that is photo reactive is typically used as the etching resist. A process for forming an etching resist pattern using the photoresist will now be described. First, a liquid photoresist is coated on a surface in which a pattern is to be formed by spin coating or similar methods to form a film. Alternatively, a dry photoresist film can be disposed on the surface by attaching or using a similar method. Then, ultraviolet rays, an electron beam or the like is selectively radiated onto a portion of the photoresist film where a pattern is to be formed or where the pattern is not to be formed using a photo-mask with the pattern. As a result, a chemical reaction occurs only in the irradiated portion. Subsequently, only a portion of the photoresist that covers the surface to be etched is removed through a developing process to form a pattern. Then, the portion of the surface that is not covered by the photoresist is selectively etched through the etching process. Finally, the photoresist material that covers a non-etched region is removed by stripping.

Although the method of forming an etching resist pattern using a photoresist is useful for forming a micro pattern, the photoresist is formed on the entire surface of a substrate even though this is unnecessary to prevent etching. In addition, all photoresist methods require an exposure process, in which an expensive exposure apparatus is used, and a photomask with a pre-designed pattern. The designing and manufacturing of the photomask requires a great amount of time.

Meanwhile, when a pattern has a large size and does not require high precision, an etching resist pattern can be formed on the surface of a substrate to be etched through an open portion of a mask having a desired pattern; the pattern can be directly drawn on the surface of a material to be etched using an etching mask material; the etching resist material can be coated on the entire surface of the substrate and then only an etching resist material covering a portion where a pattern is to be formed can be scratched to be removed; or the etching resist pattern can be formed by stamping, printing, or the like. However, these processes are expensive and require a long time because they must be performed manually. In some cases, stamps and printed board that are patterned in advance are required.

In order to overcome these problems, an etching resist material can be formed in a pattern on a substrate to be etched using an inkjet technique which is disclosed in Japanese Patent Publication Nos. sho 56-66089, sho 62-181490, and hei 9-8436 and International Patent GB9912437 (WO 01/11426). In these patents, the etching resist material is sprayed using an inkjet nozzle and then an etching process is performed to form a desired pattern. That is, according to this method, after a pattern is designed using a computer, an etching resist can be formed in a pattern directly on a substrate using an inkjet printer. As a result, the processing time and costs can be decreased.

In general, an ink composition for an etching resist used in the inkjet technique is formed by dispersing or dissolving a polymer additive, a pigment, or the like in an organic solvent. The polymer additive is typically an acryl resin, a nobolak resin, or the like, which easily dissolves or disperses in the organic solvent and has excellent etching resistance.

However, the organic solvent that is used in the ink composition pollutes the environment, and is not suitable for forming a micro pattern due to its small contact angle with respect to a substrate. These problems can be overcome by replacing the organic solvent with water or with water and an aqueous solvent. In this case, a polymer additive that easily dissolves or disperses in water and the aqueous solvent is used instead of the polymer additive described above.

Meanwhile, the ink composition for an etching resist must be highly adhesive to a metal substrate, and have high resistance against an etching solution containing water, hydrochloric acid, and iron chloride used in a subsequent etching process.

The ink composition for an etching resist that is used in Patent GB9912437 (WO 01/11426) is cured using ultraviolet rays or an electron beam. In this patent, the ink composition is not described in detail, but in general, a photo-curable ink is necessarily accompanied by a relatively expensive photo initiator. In addition, when the electron beam is used, an electron beam apparatus must be used in a vacuum. Accordingly, an ink composition that can form a hard thin layer by drying or thermal curing instead of using ultraviolet rays or an electron beam is preferable.

SUMMARY OF THE INVENTION

The present invention provides an ink composition for an etching resist which is environmentally friendly, can be formed in a micro pattern, had excellent resistance against an etching solution, and can be formed into a hard film by thermal curing and/or drying.

The present invention also provides a method of forming an etching resist pattern using an ink composition for an etching resist.

The present invention also provides a method of forming a microchannel using an ink composition for an etching resist.

According to an aspect of the present invention, there is provided a composition including: 2-50 parts by weight of an aqueous polymer or polymer emulsion (in a dry weight); and 10-95 parts by weight of water, based on 100 parts by weight of the composition.

The composition may further include an anti-drying agent of 50 or less parts by weight based on 100 parts by weight of the composition.

The composition may further include an aqueous solvent.

The composition may further include 5 or less parts by weight of a hydrophobic material of based on 100 parts by weight of the composition.

The composition may further include 5 or less parts by weight of at least one additive selected from the group consisting of a surfactant, an antifoaming agent, an ultraviolet ray-absorbing agent, a photo stabilizer, a microbe suppressor, a chelating agent, an oxygen absorber, and a heat-curing suppressor based on 100 parts by weight of the composition.

According to another aspect of the present invention, there is provided a method of forming an etching resist pattern, the method including: spraying an ink composition for an etching resist onto a substrate to form a desired pattern; and thermal curing or drying the sprayed ink composition, wherein the ink composition for an etching resist contains 2-50 parts by weight of an aqueous polymer or polymer emulsion (in a dry weight) and 10-95 parts by weight of water based on 100 parts by weight of the ink composition.

The ink composition for an etching resist may be sprayed using an inkjet.

According to yet another aspect of the present invention, there is provided a method of forming a microchannel, the method including: spraying an ink composition for an etching resist onto a substrate to form a desired pattern; thermal curing or drying the sprayed ink composition to form an etching resist pattern; selectively etching the substrate on which the etching resist pattern is formed; and removing the remaining etching resist pattern, wherein the ink composition for an etching resist contains 2-50 parts by weight of an aqueous polymer or polymer emulsion (in a dry weight) and 10-95 parts by weight of water based on 100 parts by weight of the ink composition.

BRIEF DESCRIPTION OF THE DRAWINGS

The above and other features and advantages of the present invention will become more apparent by describing in detail exemplary embodiments thereof with reference to the attached drawing in which.

DETAILED DESCRIPTION OF THE INVENTION

Figure 1:
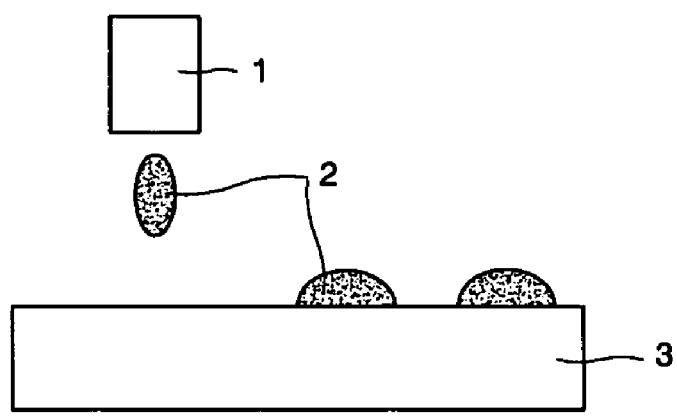
FIG. 1 is a sectional view illustrating a method of forming a microchannel using an ink composition for an etching resist.
Figure 1:
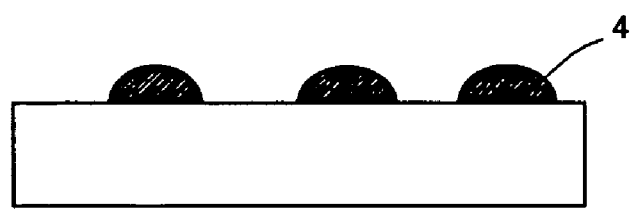
Figure 1:
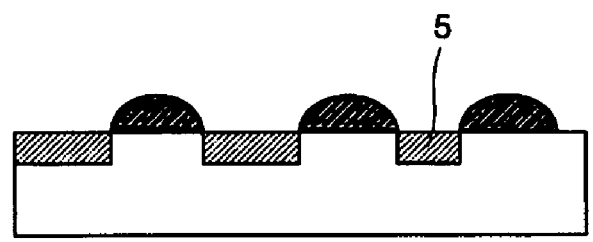
Figure 1:
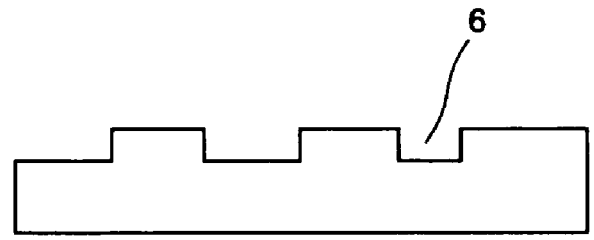

An ink composition for an etching resist according to an embodiment of the present invention includes 2-50 parts by weight of an aqueous polymer or a polymer emulsion (in a dry weight) and 10-95 parts by weight of water based on 100 parts by weight of the ink composition.

By using water as a solvent, the ink composition does not give rise to environmental problems which result from the use of a conventional organic solvent. In addition, a micro pattern can be formed due to the large contact angle of the ink composition of the present embodiment with respect to the surface of a substrate.

The amount of water of the ink composition according to an embodiment of the present invention is in the range of 10 to 95 parts by weight based on 100 parts by weight of the ink composition. In addition, the ink composition may further include an aqueous solvent, in addition to water, and in this case, the total amount of water and the aqueous solvent may be in the range of 10-95 parts by weight based on 100 parts by weight of the ink composition.

When the amount of water or the total amount of water and the aqueous solvent is less than 10 parts by weight, the viscosity of the ink composition is so high that it is difficult to spray the ink composition using a nozzle. When the amount of water or the total amount of water and the aqueous solvent is greater than 95 parts by weight, the amount of the other components is so small that a film formed after drying fails to act as an effective etching resist.

The aqueous solvent that can be used together with water is not limited, and may contain at least one solvent selected from the group consisting of methanol, ethanol, isopropanol, butanol, t-butanol, cyclohexanol, N-methylpyrrolidinon, acetone, methylethylketone, methylisobutylketone, cyclohexanone, methylcellosolve, ethylcellosolve, tetrahydrofurane, 1,4-dioxane, ethyleneglycol dimethylether, ethyleneglycol diethylether, propyleneglycol methylether, propyleneglycol dimethylether, propyleneglycol diethylether, propyleneglycol methylether acetate, propyleneglycol ethylether acetate, 3-methoxybutyl acetate, ethyl 3-ethoxypropionate, ethylcellosolve acetate, methylcellosolve acetate, butyl lactate, ethylene glycol monomethyl ether, methyl isobutyl ketone, glycol monomethyl ether, γ-butylroactone, dimethylformamide, tetramethylsulfone, ethylene glycol acetate, ethylester acetate, ethylactate, and polyethyleneglycol. The aqueous solvent that can be used together with water is not limited to the examples described above, and may be any solvent that is either well mixed or very slowly phase-separated from water in the ink composition.

The aqueous polymer or polymer emulsion included in the ink composition dissolves in water or forms an emulsion with the water, and may have a sufficiently low viscosity when diluted in the ink state, for example, a viscosity of 0.5 to 50 cp.

The aqueous polymer may be a multi-functional (meta) acryl polymer or urethane (meta) acryl polymer which contains 3 to 30 ethoxy groups or propoxy groups, and preferably, a multi-functional (meta) acryl polymer or urethane (meta) acryl polymer which contains 15 to 25 ethoxy groups.

The multi-functional (meta) acryl polymer or urethane (meta) acryl polymer which contains ethoxy groups or propoxy groups may be ethoxylated bisphenol A di(meta)acrylate, ethoxylated glycerine tri(meta)acrylate, ethoxylated polyethylene glycol di(meta)acrylate, propoxylated neopentyl glycol di(meta)acrylate, propoxylated trimethylopropane tri(meta)acrylate, ethoxylated or propoxylated pentaeritritol tetraacrylate, ethoxylated trimethylolpropane triacrylate, ethoxylated 2-methyl-1,3-propanediol diacrylate, propoxylated or ethoxylated bisphenol-A-diacrylate, ethoxylated cyclohexanedimethanol di(meta)acrylate, ethoxylated bisphenol-A-dimetacrylate, ethoxylated polypropyleneglycol di(meta)acrylate, or propoxylated polyethyleneglycol di(meta)acrylate.

The polymer emulsion may be an acryl polymer or a urethane acryl polymer emulsion. In detail, the polymer emulsion can be selected from Ebecryl products produced by UCB Co. and Neocryl products produced by Avecia Co.

The polymer emulsion exists in an emulsion state by including a surfactant, in addition to a polymer.

A crosslinking binder that can facilitate the thermal curing, such as CX-100 obtained from Avecia Co., may be added to the polymer emulsion.

The aqueous polymer or polymer emulsion is not limited to the examples described above, and may be any polymer material that can disperse or dissolve in an ink, in which water is the main solvent, to exist stably. Preferably, the molecular weight of the aqueous polymer or polymer emulsion is in the range of 300 to 500000. When the molecular weight of the aqueous polymer or polymer emulsion is less than 300, it is difficult to form a thin layer on the surface of the substrate. When the molecular weight of the aqueous polymer or polymer emulsion is greater than 500000, the viscosity of the ink composition is so high that the inkjet nozzle can become clogged.

The aqueous polymer or polymer emulsion can be cured through thermal curing or drying.

The existence of the aqueous polymer or polymer emulsion results in a stronger resistance against an etching liquid and a greater adhesive force to the surface of the substrate.

The amount of the aqueous polymer or polymer emulsion in a dry weight may be in the range of 2-50 parts by weight, and preferably, 5-30 parts by weight based on 100 parts by weight of the ink composition. When the amount of the aqueous polymer or polymer emulsion is less than 2 parts by weight, it is difficult to form a sufficient etching resist thin layer. When the amount of the aqueous polymer or polymer emulsion is greater than 50 parts by weight, the stability of the ink composition decreases.

The ink composition for an etching resist according to an embodiment of the present invention may further include a hydrophobic material dispersion, an anti-drying agent, and any other additives.

The hydrophobic material dispersion prevents the permeation of an etching solution into the etching resist layer formed on the substrate. The hydrophobic material may be an emulsion of polytetrafluoroethylene. The amount of the added hydrophobic material in a dry weight is 5 or less parts by weight based on 100 parts by weight of the ink composition. When an excessive amount of the hydrophobic material is added, the adhesive force of the etching resist is decreased, which is undesirable.

The anti-drying agent that is added to the ink composition prevents the clogging of the inkjet nozzle resulting from the dryness of the ink composition in the nozzle. The anti-drying agent may be glycol, such as ethylene glycol, propylene glycol, diethylene glycol, triethylene glycol, or polyethylene glycol; glycerine; ether of a polyvalent alcohol, such as diethyleneglycol monobutyl ether; acetate; thioglycol; or an amino acid, such as glycine, methyl glycine, proline, alanine, or phenylalanine. The usable anti-drying agent is not limited to the examples described above, and may be any material that is typically used for inkjet ink.

The amount of the anti-drying agent may be 50 or less parts by weight based on 100 parts by weight of the ink composition. When the amount of the anti-drying material is greater than 50 parts by weight, the contact angle of the ink on the substrate becomes too small, which is undesirable.

The other additives that can be included in the ink composition may be a cationic, amphoteric, positive or non-ionic surfactant for controlling the surface tension of the ink and the contact angle on the substrate; an antifoaming agent that is a silicon or fluorine-based surfactant; an ultraviolet ray-absorbing agent, such as benzotriazol or benzophenone; a photo stabilizer, such as phenol or amine; a microbe suppressor, such as chloromethylphenol; a chelating agent, such as EDTA; a sulfurous acid-based oxygen absorber; a heat-curing suppressor, such as p-anisol, hydroquinone, pyrocatechol, t-butylcatechol, or phenothiazine. These additives can be added according to the use of the ink. The amount of the additives is less than 5 parts by weight based on 100 parts by weight of the ink composition. When the amount of the additive is 5 or more parts by weight, the etching resistance of the ink is decreased.

An etching resist pattern according to an embodiment of the present invention is formed using the ink composition for an etching resist described above.

In detail, a method of forming the etching resist pattern according to an embodiment of the present invention includes spraying the ink composition for an etching resist onto a substrate to form a desired pattern; and thermal curing or drying the sprayed ink composition.

Before the ink composition is sprayed onto the substrate, the ink composition may be appropriately filtered to remove large particles that can clog the inkjet nozzle. That is, components of the ink composition for an etching resist are mixed, and then, the mixture is appropriately filtered to remove large particles that can clog the inkjet nozzle.

The substrate on which the etching resist pattern is formed may be stainless steel, copper, a metal material, or a composite material, such as a copper clad laminate that is used in a printed circuit board, but is not limited thereto. That is, the substrate can be formed of any material that can be wet- or dry-etched.

The surface of the substrate may be subjected to a proper surface cleaning process and a surface treatment process to increase the surface adhesive force of the ink and to control the contact angle.

The surface cleaning method may be cleaning with an organic solvent or an alkali cleaning solvent to remove impurities; etching with an acidic material, such as a chromic acid, a sulfuric acid, a hydrochloric acid, or the like; a physical method, such as polishing or shot blasting; electrochemically anodizing; cleaning with ions or plasma to remove impurities; or the like. However, the surface cleaning method is not limited to the examples described above, and can be any conventional impurity-removing method.

In order to increase the adhesive force between a metal surface of the substrate and the polymer material of the ink composition, the surface of the metal substrate may be treated with an adhesion-promoting agent before the spraying using the inkjet nozzle.

The adhesion-promoting agent may be a commonly known silane-based compound, such as β-(3,4-epoxycyclohexyl)-ethyltrimethoxy silane, ɣ-glycideoxypropyl methyldiethoxy silane, ɣ-glycideoxypropyl trimethoxy silane, ɣ-glycideoxypropyl triethoxy silane, 3-metacryloxypropyl trimethoxy silane, 3-metacryloxypropyl methyldimethoxy silane, 3-metacryloxypropyl methyldiethoxy silane, 3-metacryloxypropyl triethoxy silane, N-(2-aminoethyl)-3-aminopropyl methyl dimethoxy silane, N-(2-aminoethyl)-3-aminopropyl trimethoxy silane, N-(2-aminoethyl)-3-aminopropyl triethoxy silane, 3-aminopropyl trimethoxy silane, 3-aminopropyl triethoxy silane, N-phenyl-3-aminopropyl triethoxy silane, vinyltrichloro silane, vinyl trimethoxy silane, vinyl triethoxy silane, 3-chloropropyl trimethoxy silane, 3-mercaptopropyl trimethoxy silane; or a chelating compound, such as N-hydroxyethyl-ethylenediaminotriacetic acid, nitrotriacetic acid, hydroxyethylidene-1,1-diphosphonic acid, aminotrimethylene phosphoric acid, ethylenediamino-tetramethylene phosphoric acid, diethylenetriamino pentamethylene phosphoric acid, diethylenetriamino pentamethylene phosphoric acid, hexamethyleneaminotetraethylene phosphoric acid, or the like.

The adhesion-promoting agent may be included in the ink composition for an etching resist. Alternatively, the adhesion-promoting agent can be coated on the surface of the pre-cleaned substrate before the inkjet process. This coating method is preferable because the surface of the substrate can be protected from re-contamination. In this case, a material that decreases stability or other properties of the ink composition for an etching resist can be used.

The methods described above are used to make uniform or increase the adhesive force between the substrate and the resist material. However, the scope of the present invention is not limited to these examples.

The ink composition according to an embodiment of the present invention is sprayed onto the surface of the pre-treated substrate using an inkjet apparatus to form a pattern. The inkjet apparatus may be equipped with a typical piezoelectric nozzle or a thermal "bubble-jetting" nozzle.

Then, the substrate on which the desired pattern of the ink composition is formed by spraying is dried or heat-cured.

The process of drying or thermal curing may be performed by naturally drying the substrate with the pattern or by heating the substrate with the pattern in an oven or on a thermal plate at a temperature of less than 500° C. In addition, the spraying of the inkjet ink and the heating of the substrate can be performed at the same time. Alternatively, the ink composition can be sprayed onto a pre-heated substrate. However, the scope of the present invention is not limited to described herein drying, heating, and curing methods.

A method of forming a microchannel using the etching resist pattern formed above will now be described.

The method of forming a microchannel includes selectively etching the substrate with the etching resist pattern that is formed in the above manner, and removing the remaining etching resist pattern.

The etching may be dry etching or wet etching. The wet etching may be performed using an etching solution that erodes a material. The etching solution may be a sulphuric acid, nitric acid, chromic acid, or iron chloride-hydrochloric acid aqueous solution. The dry etching may be performed using plasma or ion beams. However, the etching method is not limited to these methods.

A pattern formed by etching has a maximum depth of a few hundreds microns and a minimum width of a few microns.

The remaining etching resist layer can be removed by stripping. The stripping may be performed using an alkali or organic solvent, or a physical method, such as brushing.

The method will be described in detail with reference to FIG. 1.

FIG. 1 is a sectional view illustrating a method of forming a microchannel using the ink composition for an etching resist according to an embodiment of the present invention. Referring to operation (a) of FIG. 1, an ink 2 for an etching resist is sprayed onto a substrate 3 using an inkjet nozzle 1 of an inkjet head to form a pattern on the substrate 3. Referring to operation (b) of FIG. 1, the pattern of the ink 2 for the etching resist formed on the substrate 3 is dried or thermal cured to form a cured etching resist pattern 4. Referring to operation (c) of FIG. 1, portions that are not covered by the cured etching resist pattern 4 are etched using an etching solution, to form etched portions 5. Referring to operation (d) of FIG. 1, the remaining resist pattern 4 is removed to complete the etching process. As a result, the microchannel is formed.

The present invention will be described in further detail with reference to the following examples. These examples are for illustrative purposes only and are not intended to limit the scope of the present invention.

EXAMPLE

Manufacturing Example 1

10 parts by weight of a urethane acryl emulsion (in a dry weight), 5 parts by weight of a polytetrafluoroethylene-dispersed solution, 10 parts by weight of glycerol, 20 parts by weight of ethyleneglycol, 0.1 parts by weight of a fluorine-based surfactant, and 54.9 parts by weight of deionized water were mixed in a mixer, and then filtered using a 1-micron filter to produce an ink for an etching resist. The ink exhibited a contact angel of 35° on the surface of copper and a contact angle of 55° on the surface of stainless steel. Thus, the ink exhibited a larger contact angle and thus spread less than a conventional organic solvent.

Manufacturing Example 2

10 parts by weight of ethoxylated glycerin acrylate, 20 parts by weight of ethyleneglycol, 0.1 parts by weight of a fluorine-based surfactant, and 69.9 parts by weight of deionized water were mixed in a mixer, and then, filtered using a 1-micron filter to prepare an ink for an etching resist. The ink exhibited a viscosity of 15 cP and a contact angle of 45° on the surface of stainless steel. Thus, the ink exhibited a higher viscosity and a larger contact angel than a conventional organic solvent.

Example 1

A copper substrate was cleaned using 5% a hydrochloric acid aqueous solution and a deionized water, and then dried. The ink prepared in Manufacturing Example 1 was sprayed onto the cleaned copper substrate using an inkjet head produced by MICROFAB Co. USA to form a microchannel pattern. Then, the result was dried on a thermal plate at 80° C. for 3 minutes, completely cured on an oven at 220° C. for 30 minutes or longer, and then etched using an etching solution that contained 17 parts by weight of iron chloride and 20 parts by weight of hydrochloric acid for 30 minutes. Subsequently, the remaining etching resist pattern was removed by brushing the etched result in acetone, so that portions of the copper substrate that were not covered by the etching resist pattern were etched to a depth of 50 microns or greater and a width of 50 microns or less. As a result, a microchannel pattern was formed.

Example 2

A stainless steel substrate was rubbed with a nonwoven fabric to which a polishing agent was attached, cleaned with a 10% aqueous sulfuric acid solution, 6% (1-hydroxyethylene)diphosphonic acid (obtained from Sigma Aldrich USA), and deionized water, and then dried. The ink prepared in Manufacturing Example 2 was sprayed onto the resulting substrate using an inkjet head produced by MICROFAB USA to form a microchannel pattern. Then, the result was dried on a thermal plate at 300° C. for 30 minutes or greater, and then etched using an etching solution that contains contained 17 parts by weight of iron chloride and 20 parts by weight of hydrochloric acid for 2 hours. Subsequently, the remaining etching resist pattern was removed by brushing the etched result in acetone, so that portions of the substrate that were not covered by the etching resist pattern were etched to a depth of about 150 microns or greater and a width of 50 microns or less. As a result, a microchannel pattern was formed.

Comparative Example 1

A microchannel pattern was formed in the same manner as in Example 1 except that a resin composition for overcoat material for LCD manufacturing (acrylate polymer including an epoxthy group), in which an ethylethoxypropionate, which is an organic solvent, was used instead of water, was used. The resin composition for protecting a liquid crystalline substrate had excellent resistance against the etching solution, but the contact angle of the resin composition was less than 30 on stainless steel so that the resin composition spread in a wide area. As a result, a micro pattern with a width of 2000 microns or less could not be formed.

Comparative Example 2

A microchannel pattern was formed in the same manner as in Example 1 except that a photo-curable ink composition, in which propyleneglycolmethylether acetate, which is an organic solvent, was used instead of water and a poly(metaacrylate-benzylmetaacrylate) was used as a polymer additive, and the pattern formed using the inkjet was cured by ultraviolet rays. The photo-curable ink composition had excellent resistance against the etching solution, but the contact angle of the resin composition was less than 3° on stainless steel so that the resin composition spread in a wide area, which is what happened in Comparative Example 1. As a result, a micro pattern with a width of 2000 microns or less could not be formed.

When using an ink composition according to an embodiment of the present invention, a pattern can be easily formed, changed, and stored using only computer program data; an apparatus for irradiating radioactive rays is not required; and a large contact angle on a substrate and less dispersion can be obtained by using water or an aqueous solvent. Therefore, the ink composition is suitable for forming a micro pattern. In addition, the environmental pollution caused by the use of a volatile organic solvent can be prevented.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A composition consisting of:
   2-50 parts by weight of an aqueous polymer or polymer emulsion based on the dry weight of the aqueous polymer or the polymer emulsion; and
   10-95 parts by weight of water, 50 or less parts by weight of an anti-drying agent, 5 or less parts by weight of a hydrophobic material, and 5 or less parts by weight of at least one additive selected from the group consisting of a surfactant. an antifoaming agent, an ultraviolet ray-absorbing agent, a photo stabilizer, a microbe suppressor, a chelating agent, an oxygen absorber, and a heat-curing suppressor, based on 100 parts by weight of the composition;
   wherein the composition is capable of drying or curing without being exposed to a radioactive ray.

2. The composition of claim 1, wherein the aqueous polymer is a multi-functional (meta)acryl polymer or urethane (meta)acryl polymer which contains 3-30 ethoxy or propoxy groups.

3. The composition of claim 2, wherein the multi-functional (meta)acryl polymer or urethane (meta)acryl polymer which contains ethoxy groups or propoxy groups is ethoxylated bishenol A di(meta)acrylate, ethoxylated glycerine tri(meta)acrylate, ethoxylated polyethylene glycol di(meta)acrylate, propoxylated neopentyl glycol di(meta)acrylate, propoxylated trimethylopropane tri(meta)acrylate, ethoxylated or propoxylated pentaeritritol tetraacrylate, ethoxylated trimethylopropane tricrylate, ethoxylated 2-methol-1,3-propanediol diacrylate, propoxylated or ethoxylated bisphenol-A-diacrylate, ethoxylated cyclohexanedimethanol di(meta)acrylate, ethoxylated bisphenol-A-dimetacrylate, ethoxylated, polypropyleneglycol di(meta)acrylate, or propoxylated polyethyleneglycol di(meta)acrylate.

4. The composition of claim 1, wherein the polymer emulsion is one of an acryl polymer and a urethane acryl polymer emulsion.

5. A method of forming an etching resist pattern, the method comprising:
   spraying an ink composition for an etching resist onto a substrate to form a desired pattern; and
   thermal curing or drying the sprayed ink composition,
   wherein the ink composition for the etching resist consists of
   2-50 parts by weight of an aqueous polymer or polymer emulsion based on the dry weight of the aqueous polymer or the polymer emulsion and
   10-95 parts by weight of water, 50 or less parts by weight of an anti-drying agent, 5 or less parts by weight of a hydrophobic material, and 5 or less parts by weight of at least one additive selected from the group consisting of a surfactant, an antifoaming agent, an ultraviolet ray-absorbing agent, a photo stabilizer, a microbe suppressor, a chelating agent, an oxygen absorber, and a heat-curing suppressor, based on 100 parts by weight of the ink composition.

6. The method of claim 5, wherein the ink composition for the etching resist is sprayed using an ink jet.

7. A method of forming a microchannel, the method comprising:
   spraying an ink composition for the etching resist onto a substrate to form a desired pattern;
   thermal curing or drying the sprayed ink composition to form an etching resist pattern;
   selectively etching the substrate on which the etching resist pattern is formed; and
   removing the remaining etching resist pattern,
   wherein the ink composition for the etching resist consists of
   2-50 parts by weight of an aqueous polymer or polymer emulsion based on the dry weight of the aqueous polymer or the polymer emulsion and
   10-95 parts by weight of water, 50 or less parts by weight of an anti-drying agent, 5 or less parts by weight of a hydrophobic material, and 5 or less parts by weight of at least one additive selected from the group consisting of a surfactant, an antifoaming agent, an ultraviolet ray-absorbing agent, a photo stabilizer, a microbe suppressor, a chelating agent, an oxygen absorber, and a heat-curing suppressor, based on 100 parts by weight of the ink composition.

* * * * *